United States Patent
Aust et al.

(10) Patent No.: US 12,044,735 B2
(45) Date of Patent: Jul. 23, 2024

(54) METHOD FOR MEASURING INSULATION RESISTANCE IN INVERTERS WITH MULTIPOINT TOPOLOGY, AND INVERTER WITH MULTIPOINT TOPOLOGY

(71) Applicant: SMA Solar Technology AG, Niestetal (DE)

(72) Inventors: Steffen Aust, Kassel (DE); Martin Putz, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 299 days.

(21) Appl. No.: 17/231,390

(22) Filed: Apr. 15, 2021

(65) Prior Publication Data

US 2021/0231735 A1    Jul. 29, 2021

Related U.S. Application Data

(63) Continuation of application No. PCT/EP2019/078165, filed on Oct. 17, 2019.

(30) Foreign Application Priority Data

Oct. 22, 2018   (DE) ...................... 10 2018 126 235.3

(51) Int. Cl.
*G01R 31/327* (2006.01)
*G01R 27/20* (2006.01)
*G01R 31/52* (2020.01)

(52) U.S. Cl.
CPC ....... *G01R 31/3277* (2013.01); *G01R 27/205* (2013.01); *G01R 31/52* (2020.01)

(58) Field of Classification Search
CPC ... G01R 31/3277; G01R 27/205; G01R 31/52
See application file for complete search history.

(56) References Cited

U.S. PATENT DOCUMENTS 7,576,547 B2 * 8/2009 Muller ................... G01R 27/18
                                              324/555
9,906,022 B2 * 2/2018 Liu ........................ G01R 31/40
(Continued)

FOREIGN PATENT DOCUMENTS

CN      105990868 A   * 10/2016
DE   102016221282 A1  *  5/2017 ............ B60L 3/0069
(Continued)

OTHER PUBLICATIONS

International Search Report dated Feb. 4, 2019 in connection with PCT/EP2019/078165.

*Primary Examiner* — Lee E Rodak
*Assistant Examiner* — Demetrius R Pretlow
(74) *Attorney, Agent, or Firm* — Eschweiler & Potashnik, LLP

(57) ABSTRACT

A method for measuring insulation resistance in an inverter that has a DC link circuit and a bridge circuit, connected to the DC link circuit, for driving an AC current via a bridge center tap is disclosed. The method includes connecting the bridge center tap to a grounding point, successively connecting, by way of the bridge circuit, the bridge center tap that is connected to the grounding point to two points of the ungrounded DC link circuit that differ in terms of voltage, and measuring the current flowing from the two points that differ in terms of voltage to the grounding point. The two points of the ungrounded DC link circuit that differ in terms of voltage are selected from a group of points that includes at least one intermediate voltage point of the DC link circuit in addition to two end points of the DC link circuit, such that the voltages present between the two points that differ in terms of voltage and the grounding point do not exceed a predefined voltage limit value.

11 Claims, 2 Drawing Sheets

(56) References Cited

U.S. PATENT DOCUMENTS

| | | | |
|---|---|---|---|
| 9,906,134 B1* | 2/2018 | Tsai | G01R 27/18 |
| 2008/0007277 A1* | 1/2008 | Backhaus | G01R 31/52 |
| | | | 324/713 |
| 2012/0026631 A1 | 2/2012 | Kazemi | |
| 2012/0119755 A1* | 5/2012 | Ishii | G01R 27/18 |
| | | | 324/551 |
| 2013/0221755 A1* | 8/2013 | Falk | H01L 31/02021 |
| | | | 307/100 |
| 2015/0084654 A1* | 3/2015 | Mueller | G01R 27/16 |
| | | | 324/713 |
| 2017/0302082 A1* | 10/2017 | Weng | H02M 7/5387 |

FOREIGN PATENT DOCUMENTS

| | | | | |
|---|---|---|---|---|
| DE | 102016116630 A1 * | 3/2018 | | B65H 75/245 |
| WO | WO-2010069620 A1 * | 6/2010 | | H02M 3/33523 |

* cited by examiner

METHOD FOR MEASURING INSULATION RESISTANCE IN INVERTERS WITH MULTIPOINT TOPOLOGY, AND INVERTER WITH MULTIPOINT TOPOLOGY

CROSS REFERENCE TO RELATED APPLICATIONS

This application is a continuation of International Patent Application number PCT/EP2019/078165, filed on Oct. 17, 2019, which claims priority to German Patent Application number 10 2018 126 235.3, filed on Oct. 22, 2018, and is hereby incorporated by reference in its entirety.

FIELD

The disclosure relates to a method for measuring insulation resistance in an inverter, and to an inverter for performing such a method.

The insulation resistance measurement in the inverter involves not only the insulation resistance of the inverter itself, but also the insulation resistance of a generator, in particular a photovoltaic generator, that is connected to an input-side DC link circuit.

BACKGROUND

WO 2013/178654 A1 discloses a method for measuring an insulation resistance and an inverter having a device for measuring an insulation resistance. In the known method and the known inverter, a bridge center tap located between switching elements of a half-bridge of the inverter is connected to a grounding point by closing a grounding switch. The bridge center tap connected to the grounding point is successively connected to the two ungrounded poles of a link circuit voltage of the inverter, present at the half-bridge, by way of the switching elements of the half-bridge, and the current flowing through this connection to the grounding point is measured. The voltages of the poles of the link circuit voltage with respect to ground are thereby used as test voltages for measuring the insulation resistance and activated via the switching elements of the half-bridge.

Another method and device are known from US 2012/0026631 A1. The current flowing through the connection to the grounding point is measured here with a current sensor. The potentials of the ungrounded poles of the link circuit voltage are also measured.

While the switching elements are loaded only with half the link circuit voltage during normal operation of the inverter known from WO 2013/178654 A1, this loading may increase to the link circuit voltage when performing the method known from WO 2013/178654 A1 for measuring the insulation resistance, even if neither of the two poles of the link circuit voltage is grounded. In the case of link circuit voltages that are greater than a nominal voltage rating of the switching elements of the bridge circuit and, in particular, of hardware components of the measuring circuit, there is therefore a risk of this voltage limit value being exceeded when measuring the insulation resistance.

For inverters having higher power outputs and in particular having higher link circuit voltages in a DC link circuit, bridge circuits having a multi-level topology, for example in what are known as 3-level inverters, are known. A bridge circuit having a multi-level topology may, for example, reduce switching losses in the case of high voltages present across the switching elements. In a 3-level inverter, the bridge circuit connects its bridge center tap not only alternately to the two end points of the DC link circuit between which the link circuit voltage is present, but also to a voltage center tap of the DC link circuit, which is provided using a split link circuit.

In practice, 3-level inverters are used, for example, in photovoltaic systems whose photovoltaic generators charge the DC link circuits of the inverters to up to 1500 V, wherein switching elements having a nominal voltage rating of, for example, 1000 V are used in the bridge circuit.

SUMMARY

The disclosure is directed to a method and a corresponding inverter that allow a reliable insulation resistance measurement even when the DC link circuit is charged to a link circuit voltage that significantly exceeds a nominal voltage rating of switching elements of its bridge circuit and of hardware components of the measuring circuit, such that the voltage of one of the end points of the ungrounded DC link circuit with respect to ground may also exceed this voltage limit value.

In one embodiment, a method for measuring insulation resistance in an inverter that has a DC link circuit and a bridge circuit connected to the DC link circuit, for driving an AC current through a bridge center tap is disclosed. The method comprises connecting the bridge center tap to a grounding point, successively connecting, by way of the bridge circuit, the bridge center tap connected to the grounding point to two points of the ungrounded DC link circuit that differ in terms of voltage, and measuring the currents flowing from the two points that differ in terms of voltage to the grounding points. In one embodiment the two points of the ungrounded DC link circuit that differ in terms of voltage are selected from a group of points that comprises at least one intermediate voltage point of the DC link circuit in addition to the two end points of the DC link circuit, such that the voltages present between the two points that differ in terms of voltage and ground do not exceed a predefined voltage limit value.

The electrical potentials of the two end points of the DC link circuit correspond to the electrical potentials of its two poles between which the DC link circuit is charged to a link circuit voltage. The intermediate voltage point has an electrical potential between the electrical potentials of the two poles of the DC link circuit, and thus also a voltage with respect to ground that is between the voltages of the two end points of the DC link circuit with respect to ground.

Selecting the two points that differ in terms of voltage for the insulation resistance measurement from the group of points that also comprises the intermediate voltage point of the DC link circuit, if the link circuit voltage exceeds the predefined voltage limit value and there is thus a risk of one of the two end points of the DC link circuit exhibiting a voltage with respect to ground that likewise exceeds the voltage limit value, creates the possibility of avoiding loading of switching elements of the bridge circuit and of hardware components of the measuring circuit with voltages above the voltage limit value during the insulation resistance measurement. The hardware components of the measuring circuit may thus be designed for a lower voltage and power load than would be created for them by the maximum system voltage of the inverter with respect to ground. By way of example, cost savings, advantages in terms of robustness, lower power losses and a reduced footprint may thereby be achieved for the hardware components of the measuring circuit.

The method according to the disclosure may thus be performed in any inverter whose bridge circuit is also able to connect the bridge center tap to at least one intermediate voltage point of the DC link circuit, in addition to the two end points of the DC link circuit. This is the case with inverters having a multi-level topology, for example, those that are known as 3-level inverters, as are often used in any case with high link circuit voltages. Measuring devices for recording the voltages of all points that differ in terms of voltage from the group of possible points that differ in terms of voltage with respect to ground are likewise present in many inverters, or may be retrofitted with little effort.

When selecting the two points of the ungrounded DC link circuit that differ in terms of voltage from the group of points also comprising at least one intermediate voltage point of the DC link circuit, it is possible to check whether one of the two voltages present between the two end points of the DC link circuit and ground exceeds the predefined voltage limit value. If this is not the case, the two end points of the DC link circuit are selected for the insulation resistance measurement. However, if one of the two end points exceeds the voltage limit value with its voltage with respect to ground, the other end point of the DC link circuit at which the voltage with respect to ground does not exceed the predefined voltage limit value and the intermediate voltage point of the DC link circuit are selected as the two points that differ in terms of voltage.

Specifically, in one embodiment the selection of the two points of the ungrounded DC link circuit that differ in terms of voltage may be implemented such that, in a first test, it is checked whether the voltage present between a first of the two end points of the DC link circuit and ground exceeds the predefined voltage limit value, and, in a second test, it is checked whether the voltage present between the second of the two end points of the DC link circuit and ground exceeds the predefined voltage limit value. Then, based on a first result of the first test and a second result of the second test, a truth table may be used to determine which two points of the ungrounded DC link circuit that differ in terms of voltage are selected from the group of points. This truth table may in one embodiment take the following form:

| Test results | | | | |
|---|---|---|---|---|
| Voltage 1st | Voltage 2nd | Resulting selection | | |
| End point to PE > limit value | End point to PE > limit value | 1st End point | 2nd End point | Intermediate voltage point |
| No | No | Yes | Yes | No |
| Yes | No | No | Yes | Yes |
| No | Yes | Yes | No | Yes |

In the above truth table, the entry in the first row, that is to say the selection of the first and the second end points as the two points that differ in terms of voltage, if both voltages of the first and the second end points with respect to ground do not exceed the predefined voltage limit value, leads to a maximum difference between the two voltages that drive the current flowing to the grounding point, which is beneficial for the accurate measurement of the insulation resistance. However, it would also be permissible to select one of the two end points and the intermediate voltage point as the two points of the ungrounded DC link circuit that differ in terms of voltage in such circumstances.

As an alternative, the selection of the two points of the ungrounded DC link circuit that differ in terms of voltage may be implemented such that, in a first sub-step, it is checked whether a link circuit voltage present between the two end points of the DC link circuit actually exceeds the predefined voltage limit value. If this is not the case, it may generally be assumed that the two voltages between the two end points of the DC link circuit and ground also do not exceed the limit value, because the two voltages between the two end points of the DC link circuit and ground, in the case of an ungrounded DC link circuit, although they do not have to be equal and also will not be equal, generally do not have the same mathematical sign. The two end points of the DC link circuit may accordingly be selected as the two points that differ in terms of voltage.

In a second sub-step of selecting the two points that differ in terms of voltage, which is performed only when the link circuit voltage exceeds the predefined voltage limit value, it may then be checked whether the voltage present between a first of the two end points of the DC link circuit, that is to say between a first of the two poles of the DC link circuit, and ground exceeds the limit value that is present. If this is the case, the second of the two end points and the intermediate voltage point of the DC link circuit are selected as the two points of the ungrounded DC link circuit that differ in terms of voltage, because it may be assumed that the two voltages of these two points that differ in terms of voltage with respect to ground do not exceed the voltage limit value, provided that the intermediate voltage point is a voltage center tap of the DC link circuit, provided that the link circuit voltage is within the permissible range of less than twice the voltage limit value, and provided that it holds true that the two voltages between the two end points of the DC link circuit and ground do not have the same mathematical sign.

In a third sub-step of selecting the two points that differ in terms of voltage, which is performed only when the voltage present between the first of the two end points of the DC link circuit and ground does not exceed the predefined voltage limit value, it may be checked whether the voltage present between the second of the two end points of the DC link circuit and ground exceeds the voltage limit value. If this is not the case, the two end points of the DC link circuit may be selected as the two points of the ungrounded DC link circuit that differ in terms of voltage, even though the link circuit voltage present between them exceeds the voltage limit value. Otherwise, the first of the two end points and the intermediate voltage point of the DC link circuit are selected, because there is not a voltage with respect to ground present there that exceeds the voltage limit value. This applies at least when the intermediate voltage point is a voltage center tap of the DC link circuit and the link circuit voltage remains within the permissible range of less than twice the voltage limit value. Due to the topology of the inverter, the available intermediate voltage point of the DC link circuit will generally in any case be the voltage center tap of the DC link circuit.

It goes without saying that, for each of the above-mentioned tests as to whether a voltage exceeds the predefined voltage limit value, the respective voltage does not have to be measured directly, but may also be derived from other measured values, for example from other measured voltages that are linked to the respective voltage of interest via a voltage cycle. The voltage between the second of the two end points of the DC link circuit and ground may thus be determined from the voltage between the first of the two end points of the DC link circuit and ground, on the one hand, and the link circuit voltage, on the other hand, through subtraction.

In one embodiment, the predefined voltage limit value may be between 800 and 1500 V or between 900 and 1200 V, that is to say 1000 V, for example.

The method according to the disclosure may, besides its special features described here with regard to the selection of the points of the ungrounded DC link circuit that differ in terms of voltage, be implemented, with regard to all details, as is known from WO 2013/178654 A1.

In one embodiment, when the currents flowing to the grounding point are measured, the bridge center tap is regularly disconnected from an AC grid that is connected during normal operation of the inverter, that is to say when the AC current is driven via the bridge center tap.

In one embodiment, the current flowing in each case to the grounding point may be measured via a voltage drop across a measuring resistor that is connected between the bridge center tap and the grounding point. The voltage drop across the measuring resistor may, for example, be measured using a measuring apparatus of the inverter that, during normal operation of the inverter, measures a voltage drop across a relatively low-resistance measuring resistor in order to measure the AC current.

In one embodiment, the switching elements of the bridge circuit may be closed in succession in order to allow two DC currents to flow in succession from the two points of the DC link circuit that differ in terms of voltage to the grounding point. The insulation resistance may be calculated in a known manner from the current strengths of the two DC currents and the associated voltages of the points that differ in terms of voltage with respect to ground.

As an alternative, in one embodiment the switching elements of the bridge circuit may be driven so as to allow a low-frequency AC current to flow from the two points that differ in terms of voltage to the grounding point through a line reactor of the inverter. This low-frequency AC current then has a period duration that is longer by at least a factor of 2, or at least a factor of 5, or at least a factor of 10, or at least a factor of 50, or at least a factor of 100 than the AC current flowing during normal operation of the inverter.

The switching elements of the bridge circuit may also be driven so as to set at least one driving voltage for the current flowing through a line reactor of the inverter to the grounding point at a filter output of a filter connected downstream of the bridge center tap, which voltage is between the voltages of the two points of the DC link circuit that differ in terms of voltage with respect to ground.

The voltage driving the respective current to the grounding point may be measured using one or more measuring apparatuses wherein the voltages present between the two points that differ in terms of voltage and ground are measured when said two points of the ungrounded DC link circuit that differ in terms of voltage are selected. Furthermore, in order to measure the current flowing in each case to the grounding point, it is possible to determine a voltage that is present between a point located between a protective resistor and the grounding point and one of the points of the ungrounded DC link circuit that differ in terms of voltage. Specifically, the voltage of this point may be measured with respect to the voltage center tap of the DC link circuit.

In one embodiment an inverter according to the disclosure has a DC link circuit, a bridge circuit connected to the DC link circuit for driving an AC current through a bridge center tap, and a device for measuring an insulation resistance. The device has a grounding switch by way of which the bridge center tap is able to be connected to a grounding point and that is designed to successively connect, by way of the bridge circuit, the bridge center tap connected to the grounding point to two different points of the ungrounded DC link circuit and to measure the current flowing from the two points that differ in terms of voltage to the grounding point. The bridge circuit is a multi-level circuit that is designed, when driving the AC current, to also connect the bridge center tap to at least one intermediate voltage point of the DC link circuit in addition to the two end points of the DC link circuit between which the link circuit voltage is present, and the device for measuring the insulation resistance in one embodiment is designed to perform the method according to the disclosure.

The inverter according to the disclosure is accordingly one with a multi-level topology. It may, for example, be a 3-level inverter. The bridge circuit is then a three-level circuit that is designed, when driving the AC current, to also connect the bridge center tap to a voltage center tap as the at least one intermediate voltage point of the DC link circuit in addition to the two end points.

A nominal voltage rating of switching elements of the bridge circuit and/or of components of the device that are specifically provided for measuring the insulation resistance may be equal to the predefined voltage limit value in the inverter according to the disclosure. The maximum link circuit voltage to which the DC link circuit is charged during operation of the inverter, on the other hand, may significantly exceed the voltage limit value, for example by 50%.

In one embodiment of the inverter according to the disclosure, the device may be configured to open a mains switch of the inverter in order to disconnect the bridge center tap for measuring the current flowing to the grounding point from an AC grid that is connected during normal operation of the inverter.

In one embodiment, the device may furthermore have a measuring resistor arranged between the bridge center tap and the grounding point and be designed to measure the current flowing to the grounding point in the form of a voltage drop across this measuring resistor. The measuring resistor may be connected in series with the grounding switch and a protective resistor in order to avoid high ground currents between the bridge center tap and the grounding point.

In one embodiment, a connection of the bridge center tap to the grounding point may branch off from a current path through which the AC current flows during normal operation of the inverter, wherein measuring apparatuses of the inverter that, during normal operation of the inverter, measure a voltage drop across a further measuring resistor that has a lower resistance than the measuring resistor for the current flowing to the grounding point may be connected across the measuring resistor and the further measuring resistor, such that they may be used for measuring both the AC current and the current to the grounding point.

In one embodiment, the device may also be configured to connect the grounding point to a filter output of a filter connected downstream of the bridge center tap.

The device may have additional measuring apparatuses in order to measure a voltage driving the respective current to the grounding point. These measuring apparatuses may also be used to select the two points of the DC link circuit that differ in terms of voltage according to the method according to the disclosure.

In one embodiment, a filter capacitor may be connected in parallel with the measuring resistor for measuring the current flowing to the grounding point.

In one embodiment, measuring apparatuses for measuring the current flowing in each case to the grounding point may be configured to measure a voltage that is present between a point located between a protective resistor and the grounding point and one of the points of the ungrounded DC link circuit that differ in terms of voltage. The respective point may be located between the protective resistor and the grounding switch, wherein the protective resistor may be located between the grounding switch and the grounding point. One of the points of the ungrounded DC link circuit that differ in terms of voltage, with respect to which the voltage is measured, may be the voltage center tap of the DC link circuit.

In one embodiment, at a filter output between a line reactor of the inverter and the protective resistor, a filter capacitor may be connected between the connection to the grounding point and one of the points of the ungrounded DC link circuit that differ in terms of voltage. This point that differs in terms of voltage may also be the voltage center tap of the ungrounded DC link circuit.

Advantageous developments of the disclosure will emerge from the patent claims, the description and the drawings. The advantages, cited in the description, of features and of combinations of multiple features are merely examples and can take effect alternatively or cumulatively without the advantages necessarily having to be attained from embodiments according to the disclosure. Without amending the subject matter of the appended patent claims, the following applies to the disclosure content of the original application documents and the patent: further features may be inferred from the drawings, in particular from the relative arrangement and operational connection of components. The combination of features of different embodiments of the disclosure or of features of different patent claims is likewise possible as a departure from the selected back-references of the patent claims, and is encouraged hereby. This also relates to such features as are depicted in separate drawings or are cited in the description thereof. These features may also be combined with features of different patent claims. Similarly, features listed in the patent claims may be dispensed with for further embodiments of the disclosure.

In terms of their number, the features cited in the patent claims and the description may be understood to mean that precisely this number or a larger number than the cited number is present, without there being any need for explicit use of the adverb "at least". For instance, when for example a switching element is mentioned, this should be understood to mean that precisely one switching element, two switching elements or more switching elements are present. The features cited in the patent claims may be supplemented by other features or be the only features that the respective method or product contains.

The reference symbols contained in the patent claims do not restrict the scope of the subjects protected by the patent claims. They merely serve the purpose of making the patent claims more easily understood.

BRIEF DESCRIPTION OF THE FIGURES

The following text further explains and describes the disclosure with reference to example embodiments illustrated in the figures.

DETAILED DESCRIPTION

Figure 1:
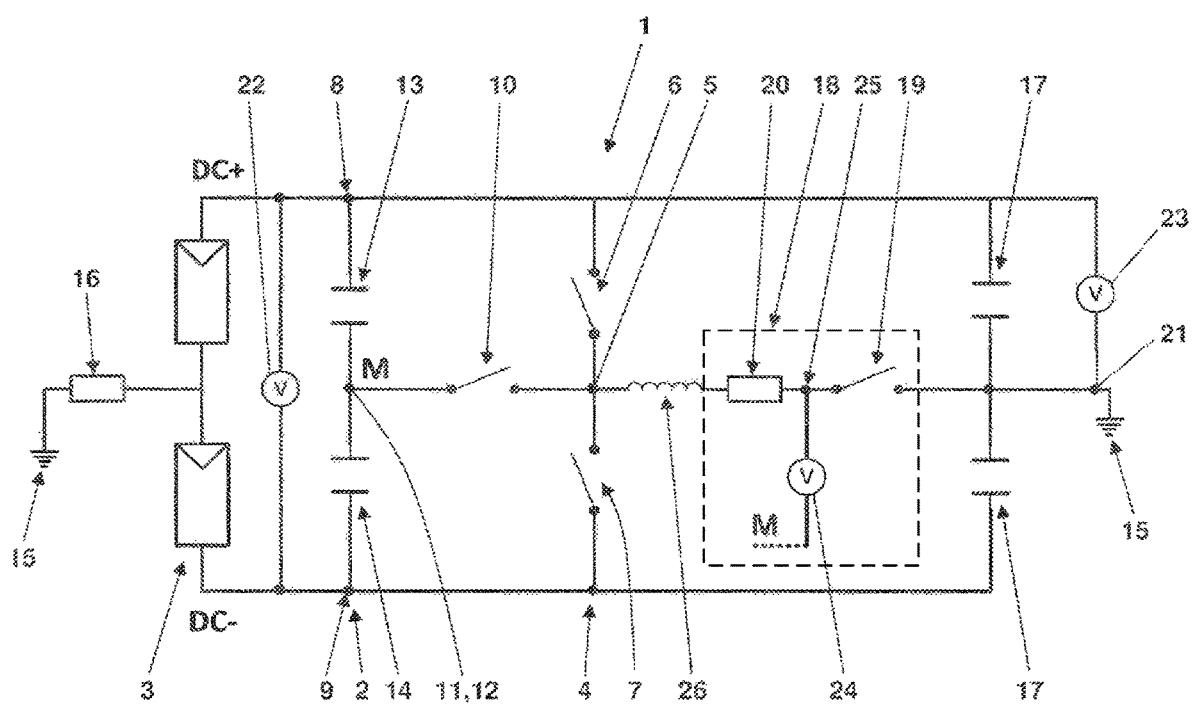
FIG. 1 is a basic circuit diagram of an inverter according to the disclosure, having a photovoltaic generator connected to its input-side DC link circuit.

In FIG. 1 an inverter 1 with a photovoltaic generator 3 connected to its input-side DC link circuit 2 is shown. The inverter 1 has a bridge circuit 4 connected to the DC link circuit 2, which bridge circuit is designed as a multi-level circuit, specifically as a three-level circuit. A bridge center tap 5 is able to be connected not only by way of two switching elements 6 and 7 to end points 8 and 9 of the DC link circuit 2, but also by way of an additional switching element 10 to an intermediate voltage point 11, specifically a voltage center tap 12 between two equal link circuit partial capacitances 13 and 14 of the DC link circuit 2. The DC link circuit 2 is charged to a link circuit voltage by the photovoltaic generator 3. In the case of a photovoltaic generator 3 having a center tap that is neither directly nor indirectly grounded, a significant voltage may develop between the voltage center tap 12 and ground 15, and this voltage may vary greatly over the operation of the inverter 1. The voltages between the end points 8 and 9 of the DC link circuit 2 and ground 15 may thus reach values that are significantly greater than half the link circuit voltage.

An insulation resistance 16 of the photovoltaic generator 3 and of the connected inverter 1 with respect to ground 15 should be checked at least before the photovoltaic generator 3 and the inverter 1 start operating. Currents flowing from the photovoltaic generator 3 to ground 15 are also determined by stray capacitances 17. The inverter 1 has a device 18 for measuring the ohmic insulation resistance 16. The device 18 comprises a grounding switch 19 in order to connect the bridge center tap 5 to a grounding point 21 across a measuring resistor 20. If the bridge center tap 5 is then connected by way of one of the switching elements 6, 7 or 10 to one of the end points 8 and 9 or the voltage center tap 12 of the DC link circuit 2, a current flows through the measuring resistor 20 to ground 15, the DC component of which current, because the DC link circuit 2 is electrically connected to ground 15 only via the insulation resistance 16 of the photovoltaic generator 3, is determined by this insulation resistance 16. For complete measurement of the insulation resistance 16, at least two voltages that are as different as possible with respect to ground 15 should be applied to the bridge center tap 5 using the switching elements 6, 7, 10, these voltages driving the current to ground 15 with different strengths and/or directions through the measuring resistor 20. The influence of the insulation resistance 16 on the current to ground 15 depends on how the insulation resistance 16 is distributed over the photovoltaic generator 3, that is to say the voltage with respect to ground 15 in the photovoltaic generator 3 for which the insulation resistance 16 has its lowest value. Different voltages that drive the current to the grounding point 21 through the measuring resistor 20 may also be set in the form of an AC voltage, which should then however have a low frequency such that the resulting AC current through the measuring resistor 20 is not dominated by the stray capacitances 17.

Measuring apparatuses 22 to 24 are provided in order to measure the voltage driving the current through the measuring resistor 20. The measuring apparatus 22 measures the link circuit voltage present across the DC link circuit 2. The measuring apparatus 23 measures the voltage of the end point 8 of the DC link circuit 2 with respect to ground 15. From this, in combination with the voltage measured using the measuring apparatus 22, it is also possible to determine the voltage of the second end point 9 of the DC link circuit 2 with respect to ground 15. The measuring apparatus 24 determines the voltage between a point 25 and the voltage center tap 12. The point 25 is located between the measuring resistor 20 and the grounding switch 19. When the grounding switch 19 is closed and the switching element 10 is closed, the measuring apparatus 24 measures the voltage drop across the measuring resistor 20. When the grounding switch 19 is closed and the switching element 10 is open, the measuring apparatus 24 measures the voltage between the voltage center tap 12 and ground 15. Using the mesh rule, it is possible to use the voltages measured by the measuring apparatuses 22 to 24 to determine all other voltages of interest that are present at certain points with respect to ground 15 or that are dropped across the measuring resistor 20.

A choke 26 is part of a filter in an output of the inverter 1, via which an AC current is output during normal operation of the bridge circuit 4. This output would then branch off between the choke 26 and the measuring resistor 20, this not being illustrated in FIG. 1.

Figure 2:
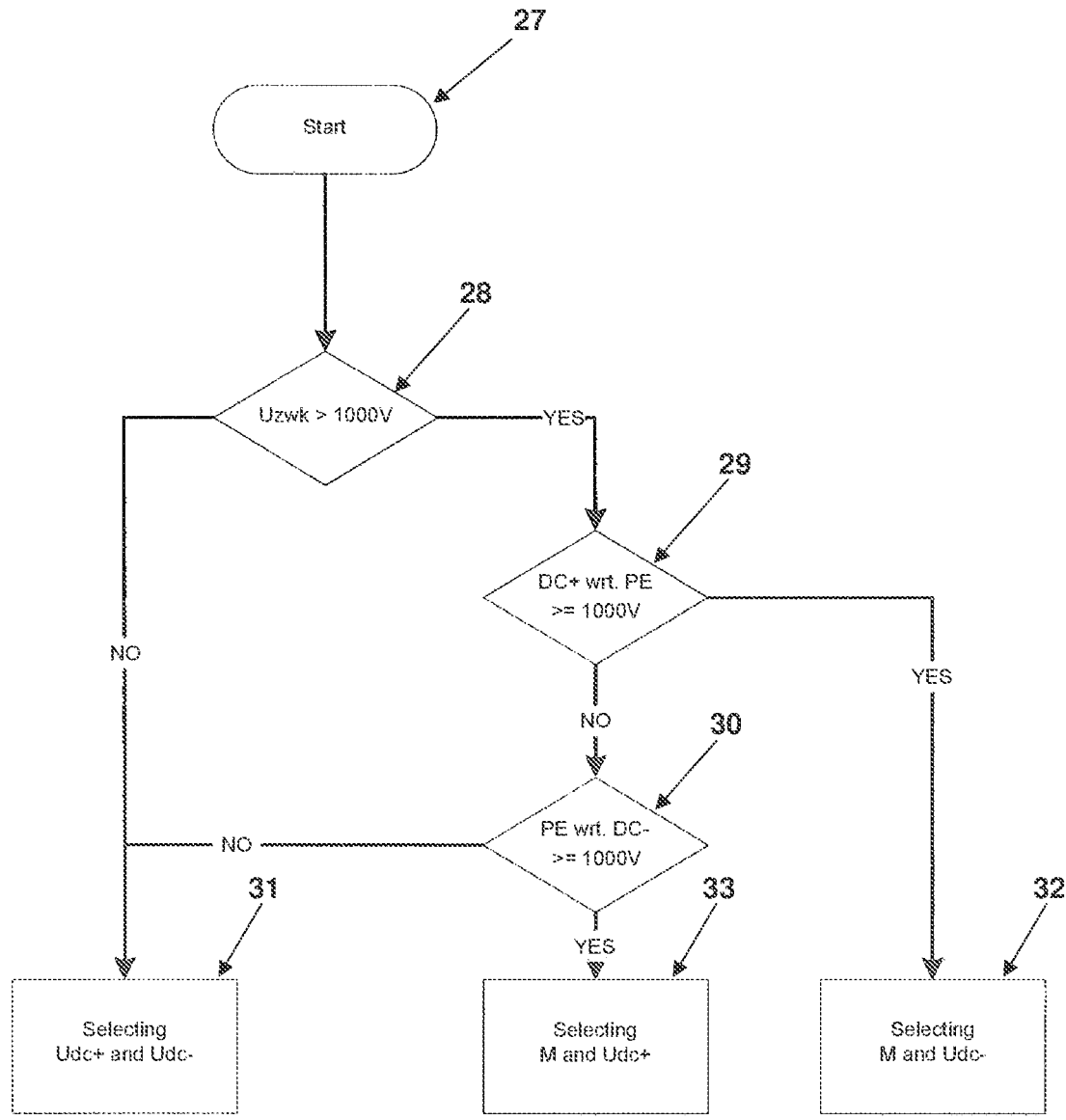
FIG. 2 is a flowchart for selecting two points of the ungrounded DC link circuit that differ in terms of voltage of the inverter according to FIG. 1 for measuring an insulation resistance in the inverter.

In order that the voltages driving the current through the measuring resistor 20 to ground 15 do not exceed a predefined voltage limit value for which the components of the inverter 1 are designed, two points of the DC link circuit 2 that differ in terms of voltage, which are successively connected by the device 18 to the bridge center tap 5 in order to measure the insulation resistance 16, are selected in accordance with the procedure illustrated in FIG. 2. After the selection has started 27, a comparison 28 takes place between the link circuit voltage Uzwk, which is measured between the end points 8 and 9 of the DC link circuit 2 by way of the measuring apparatus 22, and the predefined voltage limit value of, for example, 1000 V in this case. If the link circuit voltage Uzwk is not greater than 1000 V (NO at 28), the two poles Udc+ and Udc− of the DC link circuit 2 for driving the current through the measuring resistor 20 to ground 15 are selected at 31, that is to say the device 18 successively connects the corresponding end points 8 and 9 of the DC link circuit 2 to the bridge center tap 5 using the switching elements 6 and 7. Returning to 28, if the link circuit voltage Uzwk exceeds the predefined voltage limit value of 1000 V (YES at 28), a further comparison at 29 checks whether the voltage DC+, measured by the measuring apparatus 23, with respect to PE, that is to say between the end point 8 of the DC link circuit 2 and ground 15, is greater than or equal to the predefined voltage limit of, for example, 1000 V. If this is the case (YES at 29), in addition to the potential of the other pole Udc− of the DC link circuit 2, present at the second end point 9 of the DC link circuit 2, the potential M at the voltage center tap 12 is selected at 32 for the measurement of the insulation resistance 16. If the voltage measured using the measuring apparatus 23 is less than 1000 V (NO at 29), a comparison at 30 checks whether the voltage PE with respect to DC−, that is to say the voltage between ground 15 and the second end point 9 of the DC link circuit 2, is greater than or equal to the voltage limit value of, for example, 1000 V. This voltage is obtained by subtracting the voltage measured by the measuring apparatus 23 from the link circuit voltage measured by the measuring apparatus 22 (i.e., V22-V23). If the result of the comparison 30 is no, the two poles Udc+ and Udc− of the DC link circuit 2 are selected at 31 for driving the current through the measuring resistor 20 for the measurement of the insulation resistance 16, despite the link circuit voltage Uzwk exceeding the voltage limit value as a result. If the result of the comparison 30 is positive, however, in addition to the potential of the positive pole Udc+ of the DC link circuit 2, the potential M at the voltage center tap 12 with respect to ground is selected at 33 for the measurement of the insulation resistance 16, because at least neither of these two voltages exceeds the voltage limit value of, for example, 1000 V. Overall, by the selection of the points of the DC link circuit 2 that differ in terms of voltage for the measurement of the insulation resistance according to FIG. 2, it is achieved that the two selected points that differ in terms of voltage differ as greatly as possible in terms of their voltage with respect to ground 15, and generally also have different mathematical signs of this voltage, without one of these voltages however exceeding the voltage limit value.

The invention claimed is:

1. A method for measuring insulation resistance in an inverter that has a DC link circuit and a bridge circuit, connected to the DC link circuit, for driving an AC current via a bridge center tap, comprising:
   connecting the bridge center tap to a grounding point,
   successively connecting, by way of the bridge circuit, the bridge center tap that is connected to the grounding point to two points of the ungrounded DC link circuit that differ in terms of voltage, and
   measuring a current flowing from the two points that differ in terms of voltage to the grounding point,
   wherein the two points of the ungrounded DC link circuit that differ in terms of voltage are selected from a group of points that comprises at least one intermediate voltage point of the DC link circuit in addition to two end points of the DC link circuit, such that voltages present between the two points that differ in terms of voltage and the grounding point do not exceed a predefined voltage limit value.

2. The method as claimed in claim 1, wherein when selecting the two points of the ungrounded DC link circuit that differ in terms of voltage:
   checking whether one of the two voltages present between the two end points of the DC link circuit and ground exceeds the predefined voltage limit value, and
   when this is the case, selecting the end point of the DC link circuit at which the voltage does not exceed the predefined voltage limit value and the intermediate voltage point of the DC link circuit, and
   when this is not the case, selecting the two end points, or the intermediate voltage point and one of the two end points of the DC link circuit.

3. The method as claimed in claim 2, wherein selecting the two points further comprises;
   in a first test, checking whether the voltage present between a first of the two end points of the DC link circuit and the grounding point exceeds the predefined voltage limit value,
   in a second test, checking whether the voltage present between a second of the two end points of the DC link circuit and the grounding point exceeds the predefined voltage limit value, and
   based on a first result of the first test and a second result of the second test, using a truth table to determine which two points of the ungrounded DC link circuit that differ in terms of voltage are selected from the group of points.

4. The method as claimed in claim 2, wherein in a first sub-step of selecting the two points of the ungrounded DC link circuit that differ in terms of voltage:

checking whether a link circuit voltage present between the two end points of the DC link circuit exceeds the predefined voltage limit value, and when this is not the case, selecting the two end points of the DC link circuit.

5. The method as claimed in claim 4, wherein in a second sub-step of selecting the two points of the ungrounded DC link circuit that differ in terms of voltage, when the link circuit voltage exceeds the predefined voltage limit value:

checking whether the voltage present between a first of the two end points of the DC link circuit and the grounding point exceeds the predefined voltage limit value, and when this is the case, selecting the second of the two end points and the at least one intermediate voltage point of the DC link circuit.

6. The method as claimed in claim 5, wherein, in a third sub-step of selecting the two points of the ungrounded DC link circuit that differ in terms of voltage, when the voltage present between the first of the two end points of the DC link circuit and the grounding point does not exceed the predefined voltage limit value:

checking whether the voltage present between the second of the two end points of the DC link circuit and the grounding point exceeds the predefined voltage limit value, and when this is the case, selecting the first of the two end points and the at least one intermediate voltage point of the DC link circuit are selected, and when this is not the case, selecting the two end points of the DC link circuit.

7. The method as claimed in claim 1, wherein the at least one intermediate voltage point is a voltage center tap of the DC link circuit.

8. The method as claimed in claim 1, wherein the predefined voltage limit value is between 800 and 1500 V.

9. An inverter, comprising:
a DC link circuit,
a bridge circuit, connected to the DC link circuit and configured to drive an AC current through a bridge center tap, and
a device configured to measure an insulation resistance, wherein the device comprises a grounding switch configured to selectively connect the bridge center tap to a grounding point and that is configured to successively connect, by way of the bridge circuit, the bridge center tap connected to the grounding point to two points of the ungrounded DC link circuit that differ in terms of voltage, and wherein the device further comprises a measuring device configured to measure the current flowing from the two points that differ in terms of voltage to the grounding point, wherein the bridge circuit comprises a multi-level circuit that is configured, when driving the AC current, to connect the bridge center tap to at least one intermediate voltage point of the DC link circuit in addition to two end points of the DC link circuit, and wherein the device is configured to:
connect the bridge center tap to the grounding point,
successively connect, by way of the bridge circuit, the bridge center tap that is connected to the grounding point to two points of the ungrounded DC link circuit that differ in terms of voltage, and
measure the current flowing from the two points that differ in terms of voltage to the grounding point,
wherein the two points of the ungrounded DC link circuit that differ in terms of voltage are selected from a group of points that comprises at least one intermediate voltage point of the DC link circuit in addition to two end points of the DC link circuit, such that the voltages present between the two points that differ in terms of voltage and the grounding point do not exceed a predefined voltage limit value.

10. The inverter as claimed in claim 9, wherein the bridge circuit comprises a three-level circuit that is configured, when driving the AC current, to connect the bridge center tap to a voltage center tap as the at least one intermediate voltage point of the DC link circuit in addition to the two end points.

11. The inverter as claimed in claim 9, wherein a nominal voltage rating of switching elements of the bridge circuit and/or of components of the device that are provided for measuring the insulation resistance is equal to the predefined voltage limit value.

* * * * *